United States Patent

[11] 3,601,714

[72] Inventors Conrad P. Vespie
Brookville;
Elgin J. Karklins, Kettering, both of, Ohio

[21] Appl. No. 10,517
[22] Filed Feb. 11, 1970
[45] Patented Aug. 24, 1971
[73] Assignee General Motors Corporation
Detroit, Mich.

[54] UNIJUNCTION RELAXATION OSCILLATOR PROVIDING LINEAR POTENTIAL TO FREQUENCY CONVERSION
5 Claims, 1 Drawing Fig.

[52] U.S. Cl. .......... 331/111, 331/177
[51] Int. Cl. .......... H03k 3/26
[50] Field of Search .......... 331/111; 33/177

[56] References Cited

UNITED STATES PATENTS 3,337,815 8/1967 Riggert .......... 331/111
3,388,347 6/1968 Dinzl et al. .......... 331/111

*Primary Examiner*—Roy Lake
*Assistant Examiner*—Siegried H. Grimm
*Attorneys*—Eugene W. Christen, Creighton R. Meland and Richard G. Stahr

ABSTRACT: A potential controlled oscillator having an output frequency proportional to the magnitude of an applied potential. The capacitor of a unijunction transistor relaxation-type oscillator circuit is charged linearly from a direct current potential source through a transistor connected in a constant current circuit configuration. The potential applied across the base-emitter electrodes of the transistor is determined by the magnitude of the charge on a control capacitor which is charged from the direct current potential source through a potentiometer which determines the magnitude of the charge. So that the oscillator frequency varies linearly with a change of potentiometer setting, the capacitor charging and discharging circuits include separate field effect transistor constant current circuits.

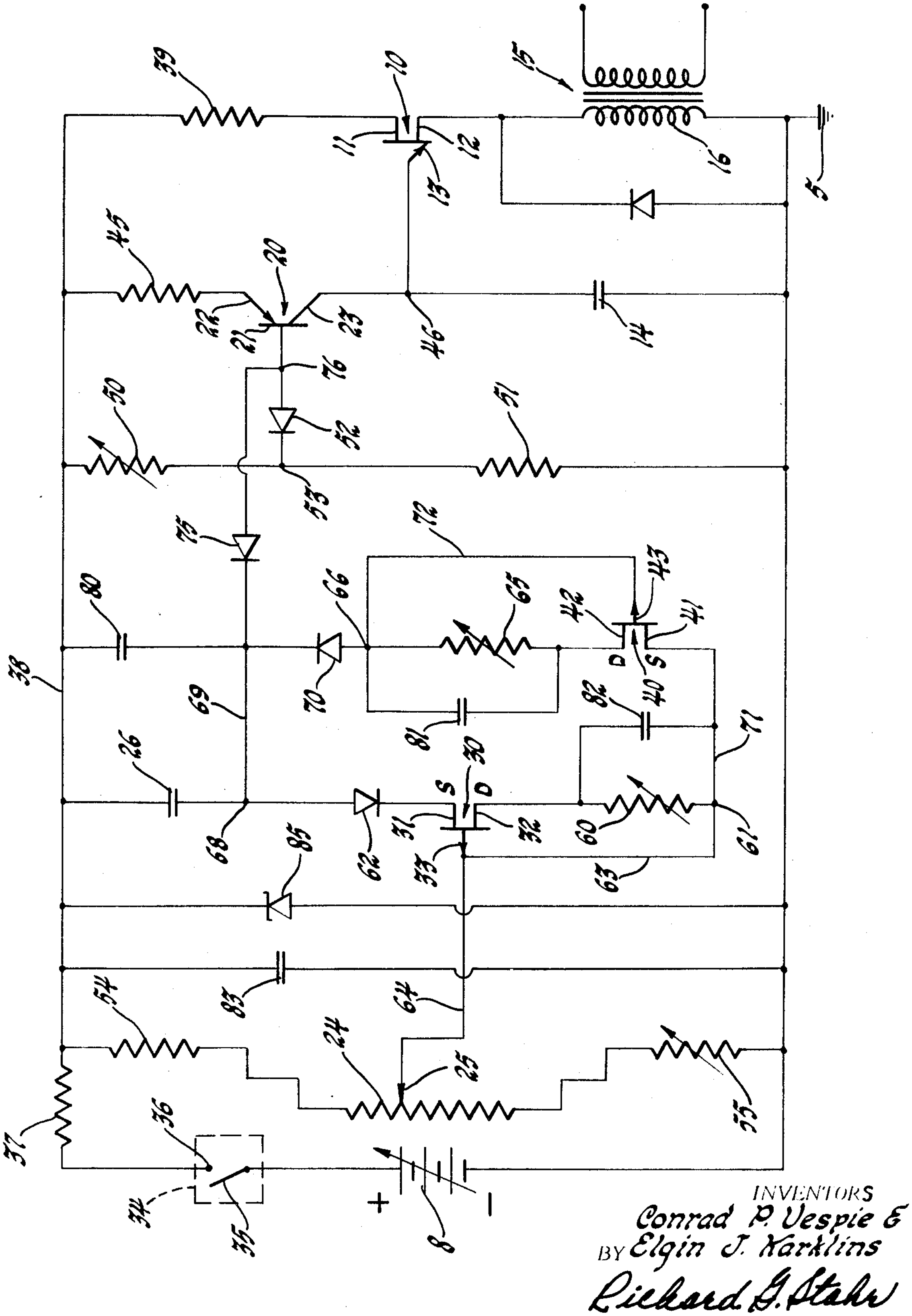
INVENTORS
Conrad P. Vespie &
BY Elgin J. Karklins
Richard G. Stahr
ATTORNEY

UNIJUNCTION RELAXATION OSCILLATOR PROVIDING LINEAR POTENTIAL TO FREQUENCY CONVERSION

This invention relates to a potential controlled oscillator and, more specifically, to a potential controlled oscillator having an output frequency variable in response to variations of the magnitude of an applied potential.

With many applications it is desirable to have an oscillator having an output frequency which is proportional to an applied potential and which varies linearly with changes of magnitude of the applied potential.

It is, therefore, an object of this invention to provide an improved potential controlled oscillator.

It is another object of this invention to provide an improved potential controlled oscillator having an output frequency which varies linearly with changes of magnitude of an applied potential.

In accordance with this invention, a potential controlled oscillator is provided wherein the capacitor of a unijunction transistor relaxation-type oscillator is charged from a direct current potential source through a transistor constant current circuit, the magnitude of the potential applied across the base-emitter electrodes of which is determined by the magnitude of the charge on a control capacitor which is charged from the direct current potential source through a potentiometer and a field effect transistor constant current circuit and discharged through a separate field effect transistor constant current circuit.

For a better understanding of the present invention, together with additional objects, advantages and features thereof, reference is made to the following description and accompanying single FIGURE drawing which sets forth the potential controlled oscillator of this invention in schematic form.

Referring to the drawing, the potential controlled oscillator of this invention is set forth in schematic form in combination with a direct current potential source, which may be a battery 8, and comprises a unijunction transistor 10 having two current-carrying electrodes, base electrode 11 and base electrode 12, and a control electrode, emitter electrode 13; a capacitor 14; an output impedance element, which may be primary winding 16 of output transformer 15; means for connecting the current-carrying electrodes of the unijunction transistor 10 and the output impedance element 16 in series across the direct current potential source; a charging circuit for capacitor 14 including a constant current circuit, which may be transistor 20 and the associated circuitry, connected across the direct current potential source; means for applying the charge on capacitor 14 across the control electrode, emitter electrode 13, and one of the current-carrying electrodes base electrode 12 of unijunction transistor 10; a control capacitor 26; a charging circuit for control capacitor 26 including a constant current circuit, which may be field effect transistor 30 and the associated circuitry, and a variable impedance element, which may be potentiometer 24, connected across the direct current potential source; a discharging circuit including a constant current circuit, which may be field effect transistor 40 and the associated circuitry, connected across control capacitor 26; and means for applying the charge on control capacitor 26 to the constant current circuit including transistor 20 for establishing the magnitude of the constant current flow therethrough.

The current-carrying electrodes, base electrodes 11 and 12, of unijunction transistor 10 and the output impedance element, shown in the FIGURE as primary winding 16 of output transformer 15 but which may be any other suitable impedance element, are connected in series across battery 8 upon the closure of movable contact 35 of switch 34 to stationary contact 36 through resistor 37, lead 38 and resistor 39, and through point of reference of ground potential 5.

The charging circuit for capacitor 14 includes a constant current circuit which may be type PNP transistor 20 having the usual current-carrying electrodes, emitter electrode 22 and collector electrode 23, and a control electrode, base electrode 21. The current-carrying electrodes of transistor 20, emitter electrode 22 and collector electrode 23 and capacitor 14 are connected in series across the direct current potential source, battery 8, upon the closure of movable contact 35 of switch 34 to stationary contact 36 through resistor 37, lead 38 and resistor 45, and through point of reference or ground potential 5.

To apply the charge on capacitor 14 across the control electrode and one of the current-carrying electrodes of unijunction transistor 10, the control electrode, emitter electrode 13, of unijunction transistor 10 is connected to junction 46 between the current-carrying electrode of transistor 20 and capacitor 14, the current-carrying electrode, base electrode 12, being connected to the other plate of capacitor 14 through primary winding 16 and point of reference or ground potential 5.

To produce a bias potential for transistor 20, a variable resistor 50 and a fixed resistor 51 are connected in series across the direct current potential source, battery 8. The potential which appears across variable resistor 50 is applied across the control electrode, base electrode 21, and a selected one of the current-carrying electrodes, emitter electrode 22, of type PNP transistor 20 through a diode 52 connected between base electrode 21 of transistor 20 and junction 53 between variable resistor 50 and fixed resistor 51 and poled to conduct the control electrode current of transistor 20 and through resistor 45.

The means for charging control capacitor 26 by the direct current potential source through a first constant current circuit and a variable impedance element for changing the magnitude of the charge of control capacitor 26 is a charging circuit which comprises a variable impedance element, which may be potentiometer 24 having a movable contact 25, connected across the source of direct current potential, battery 8, through resistors 54 and 55, an N-channel-type field effect transistor 30 having a source electrode 31, a drain electrode 32 and a control or gate electrode 33 and an impedance element 60. Control capacitor 26, the source and drain electrodes 31 and 32 of field effect transistor 30 and impedance element 60 are connected in series across the positive polarity terminal of battery 8 and movable contact 25 of potentiometer 24 through a circuit which may be traced from the positive polarity terminal of battery 8 through switch 34, resistor 37, control capacitor 26, diode 62, the source and drain electrodes 31 and 32 of unijunction transistor 30, impedance element 60, and leads 63 and 64 to movable contact 25 of potentiometer 24.

The control electrode of field effect transistor 30 is connected to the end of impedance element 60 which, with current flow therethrough, will provide a potential upon the control electrode of a polarity with respect to the source electrode which will reduce source-drain current flow therethrough. As field effect transistor 30 is of the N-channel-type, to reduce source-drain current flow therethrough, the control electrode must be of a potential which is negative with respect to the source electrode. Therefore, the control electrode, gage electrode 33, of field effect transistor 30 is connected to the end 61 of impedance element 60 remote from drain electrode 32 through lead 63.

This connection provides a constant current circuit for charging control capacitor 26. As charging current flows through control capacitor 26, the source-drain electrodes of field effect transistor 30 and impedance element 60, the end 61 of impedance element 60 becomes more negative with respect to source electrode 31. As the gate electrode 33 is connected to end 61, of impedance element 60 through lead 63, the potential upon gate electrode 33 becomes negative with respect to source electrode 31, a condition which tends to reduce source-drain current flow through N-channel field effect transistor 30. Consequently, with any given ohmic value for impedance element 60, the current flow through the charging circuit of control capacitor 26 will stabilize at a constant current.

The discharging circuit for control capacitor 26 includes a constant current circuit which is comprised of a second N-channel-type field effect transistor 40 having a source electrode 41, a drain electrode 42, and a control or gate electrode 43 and a second impedance element 65. The second impedance element 65 and the source-drain electrodes of field effect transistor 40 are connected in series across control capacitor 26 through a circuit which may be traced from junction 68 through lead 69, diode 70, impedance element 65, the source-drain electrodes of field effect transistor 40, lead 71, leads 63 and 64, movable contact 25 of potentiometer 24, that portion of potentiometer 24 between movable contact 25 and resistor 54, resistor 54 and lead 38 to the opposite plate of control capacitor 26.

The control electrode of field effect transistor 40 is connected to the end of impedance element 65 which, with current flow therethrough, will provide a potential upon the control electrode of a polarity with respect to the source electrode which will reduce source-drain current flow therethrough. As field effect transistor 40 is of the N-channel-type, to reduce source-drain current flow therethrough, the control electrode must be of a potential which is negative with respect to the source electrode. Therefore, the control electrode, gate electrode 43 of field effect transistor 40 is connected to the end 66 of impedance element 65 remote from drain electrode 42 through lead 72.

For the same reason as explained in regard to field effect transistor 30, this connection provides a constant current circuit for the discharge of control capacitor 26.

It is well known in the art that a capacitor will charge and discharge exponentially through a resistor. It is equally well known in the art that a capacitor will charge and discharge linearly through a constant current circuit. In the circuit of this invention, therefore, capacitor 14 of the relaxation oscillator portion is charged through the transistor 20 constant current circuit hereinabove described. Consequently the output frequency of the circuit of this invention will change linearly with a linear change of magnitude of control potential applied across the base-emitter electrodes of transistor 20. However, the magnitude of the control potential applied across the base-emitter electrodes of transistor 20 above a preselected minimum frequency is determined by the magnitude of the charge on control capacitor 26 which charges and discharges in response to changes of the setting of movable contact 25 of potentiometer 24. If control capacitor 26 charged and discharged through a resistor or resistors, the magnitude of control potential across the base-emitter electrodes of transistor 20 and, consequently the output frequency would change exponentially. Therefore, a field effect transistor constant current circuit as hereinabove described in regard to field effect transistors 30 and 40 is included in both the charging and discharging circuits of control capacitor 26 to produce a linear charge and discharge thereof. A linear charge and discharge of control capacitor 26 provides a control potential which changes linearly with changes of the setting of movable contact 25 of potentiometer 24 across the base-emitter electrodes of transistor 20 and, hence, an output frequency which changes linearly with changes of the setting of movable contact 25 of potentiometer 24.

In the field effect transistor constant current circuits hereinabove described impedance elements 60 and 65 may be resistors. As the charging and discharging current flow therethrough, respectively, determines the source-drain conduction through respective field effect transistors 30 and 40, the ohmic value of these respective impedance elements determines the rate of charge and discharge curves. To alter or adjust the rate of charge and/or discharge of control capacitor 26, elements 60 and 65 may be variable resistors as shown in the FIGURE.

Diode 62 prevents control capacitor 26 from discharging through field effect transistor 30 and diode 70 prevents control capacitor 26 from charging through field effect transistor 40.

The charge on control capacitor 26 is applied to the first constant current circuit for establishing the magnitude of the constant current flow therethrough diode 75 connected to junction 76 between diode 52 and base electrode 21 of transistor 20 and poled to conduct transistor 20 control electrode current and a selected plate, junction 68, of control capacitor 26 and through lead 38 and resistor 45 interconnecting the opposite plate of control capacitor 26 and emitter electrode 22 of transistor 20.

Upon the closure of movable contact 35 of switch 34 to stationary contact 36, to apply battery potential across the oscillator circuit of this invention, control capacitor 26 charges linearly through the charging circuit which may be traced from the positive polarity terminal of battery 8, through switch 34, resistor 37, lead 38, control capacitor 26, diode 62, the source-drain electrodes of field effect transistor 30, variable resistor 60, leads 63 and 64, movable contact 25 of potentiometer 24, resistor 55 and point of reference or ground potential 5 to the negative polarity terminal of battery 8 to a potential magnitude as determined by the setting of movable contact 25 of potentiometer 24 which is of a positive polarity on the plate connected to lead 38 and capacitor 14 charges linearly through a circuit which may be traced from the positive polarity terminal of battery 8, through switch 34, resistor 37, lead 38, resistor 45, the emitter-collector electrodes of transistor 20, capacitor 14 and point of reference or ground potential 5 to the negative polarity terminal of battery 8. When capacitor 14 has charged to a magnitude equal to the peak point potential of the device selected for unijunction transistor 10, this device breaks down and discharges capacitor 14 through the emitter-base electrodes thereof and through primary winding 16 of output transformer 15. When the charge upon capacitor 14 has reduced to a value below the cutoff potential of unijunction transistor 10, this device goes nonconductive. As the potential applied across the emitter-base electrodes of transistor 20 is of the proper polarity relationship to produce emitter-base current flow through a type PNP transistor, emitter-base current flows through this device through a circuit which may be traced from the plate of control capacitor 26 connected to lead 38 through lead 38, resistor 45, the emitter-base electrodes of transistor 20, diode 75, poled to conduct the control electrode current of transistor 20, and lead 69 to the other plate of control capacitor 26. This emitter-base current through transistor 20 initiates emitter-collector current flow therethrough to complete the charging circuit for capacitor 14. Capacitor 14 again begins to charge linearly through the emitter-collector electrodes of transistor 20 at a rate determined by the magnitude of the charge on control capacitor 26 which is applied across the base-emitter electrodes of transistor 20 through the circuit previously described. This action is repeated so long as switch 34 is closed and the potentiometer 24 setting remains the same.

If movable contact 25 of potentiometer 24 is moved in a direction toward resistor 55, the charge upon control capacitor 26 increases in magnitude through the charging circuit previously described. The constant current circuit, field effect transistor 30 and the associated circuitry previously described, included in the charging circuit of control capacitor 26 forces the capacitor to charge linearly to the higher magnitude as determined by the latest setting of movable contact 25.

The higher magnitude charge upon control capacitor 26, of course, is applied across the base-emitter electrodes of transistor 20, a condition which increases emitter-collector conduction therethrough. With increased conduction through the emitter-collector electrodes of transistor 20, capacitor 14 charges linearly to the peak point potential of unijunction transistor 10 in a shorter time, consequently the output frequency of the oscillator increases with an increased applied potential through movable contact 25 of potentiometer 24.

Should the movable contact 25 of potentiometer 24 be suddenly moved in a direction toward resistor 54, control capacitor 26 would begin to discharge through a circuit which may be traced from the plate of control capacitor 26 connected to lead 38, through lead 38, resistor 54, movable contact 25 of potentiometer 24, leads 64, 63 and 71, the source-drain electrodes of field effect transistor 40, variable resistor 65, diode 70 and lead 69 to the other plate of control capacitor 26 to a lower potential as determined by the setting of movable contact 25 of potentiometer 24. The constant current circuit, field effect transistor 40 and the associated circuitry previously described, included in the discharging circuit of control capacitor 26 forces this capacitor to discharge linearly to the lower magnitude.

With a charge upon control capacitor 26 of a reduced magnitude, the magnitude of the emitter-base potential across transistor 20 is reduced, consequently, emitter-collector current flow therethrough is reduced. With reduced current flow through the emitter-collector electrodes of transistor 20, capacitor 14 charges to the peak point potential of unijunction transistor 10 over a longer period of time, consequently the frequency of the oscillator decreases with a decreased applied potential through movable contact 25 of potentiometer 24.

Diode 52 functions to isolate the bias-producing network comprising series connected resistors 50 and 51 from the circuit at all times during which the applied potential through movable contact 25 of potentiometer 24 produces an output frequency greater than a preselected minimum and diode 75 functions to isolate control capacitor 26 from the circuit at all times during which the applied potential through movable contact 25 of potentiometer 24 would produce an output frequency less than the preselected minimum. When control capacitor 26 is charged to a potential of a magnitude which will produce an output frequency greater than the preselected minimum, the potential of junction 76 is more negative than the potential of junction 53 to reverse bias diode 52. Reverse biased diode 52 isolates series resistors 50 and 51 from the circuit. When control capacitor 26 is charged to a potential of a magnitude which will produce an output frequency less than the preselected minimum, junction 76 is more negative than junction 68 to reverse bias diode 75. Reverse biased diode 75 isolates control capacitor 26 from the circuit. The preselected minimum frequency at which the bias circuit comprising series resistors 50 and 51 become operable may be selected by adjusting variable resistor 50. With the junction 76 of a potential more positive than junction 53, a circuit is provided for emitter-base current flow through transistor 20 which may be traced from the positive polarity terminal of battery 8 through switch 34, resistor 37, lead 38, resistor 45, the emitter-base electrodes of transistor 20, diode 52 poled to conduct the control electrode current of transistor 20, resistor 51 and point of reference or ground potential 5 to the negative polarity terminal of battery 8. Consequently transistor 20 remains conductive through the emitter-collector electrodes thereof to provide a charging circuit for capacitor 14 which continues to operate the relaxation oscillator portion at a frequency determined by the potential appearing across variable resistor 50 which is applied across the emitter-base electrodes of transistor 20.

Capacitors 80, 81, 82 and 83 are filter capacitors and the combination of resistor 37 and Zener diode 85 regulates the circuit-operating p0tential.

While specific electrical devices, transistor types and electrical polarities have been set forth in this specification, it is to be specifically understood that alternate electrical devices and transistor types possessing similar electrical characteristics with compatible electrical polarities may be substituted therefor without departing from the spirit of the invention.

While a preferred embodiment of the present invention has been shown and described, it will be obvious to those skilled in the art that various modifications and substitutions may be made without departing from the spirit of the invention which is to be limited only within the scope of the appended claims.

What is claimed is:

1. A potential-controlled oscillator comprising in combination with a direct current potential source,
   - a unijunction transistor having two current-carrying electrodes and a control electrode,
   - a capacitor,
   - an output impedance element,
   - means for connecting said current-carrying electrodes of said unijunction transistor and said output impedance element in series across said direct current potential source,
   - a charging circuit for said capacitor including a first constant current circuit connected across said direct current potential source,
   - means for applying the charge on said first capacitor across said control electrode and one of said current-carrying electrodes of said unijunction transistor,
   - a control capacitor,
   - a charging circuit for said control capacitor including a second constant current circuit and a variable impedance element connected across said direct current potential source,
   - a discharging circuit including a third constant current circuit connected across said control capacitor, and
   - means for applying the charge on said control capacitor to said first constant current circuit for establishing the magnitude of the constant current flow therethrough.

2. A potential controlled oscillator comprising in combination with a direct current potential source,
   - a unijunction transistor having two current-carrying electrodes and a control electrode,
   - a capacitor,
   - an output impedance element,
   - means for connecting said current-carrying electrodes of said unijunction transistor and said output impedance element is series across said direct current potential source,
   - a charging circuit for said capacitor including a constant current circuit connected across said direct current potential source,
   - means for applying the charge on said capacitor across said control electrode and one of said current-carrying electrodes of said unijunction transistor,
   - a variable impedance element having a movable contact,
   - means for connecting said variable impedance element across said current potential source,
   - a control capacitor,
   - a first impedance element,
   - a first field effect transistor having source and drain electrodes and a control electrode,
   - means for connecting said control capacitor, said source-drain electrodes of said first field effect transistor and said first impedance element in series across a selected polarity terminal of said direct current potential source and said movable contact of said variable impedance element,
   - means for connecting said control electrode of said first field effect transistor to the end of said first impedance element which, with current flow therethrough, will provide a potential upon said control electrode of a polarity with respect to said source electrode which will reduce source-drain current flow,
   - a second field effect transistor having source and drain electrodes and a control electrode,
   - a second impedance element,
   - means for connecting said second impedance element and said source-drain electrodes of said second field effect transistor in series across said control capacitor,
   - means for connecting said control electrode of said second field effect transistor to the end of said second impedance element which, with current flow therethrough, will provide a potential upon said control electrode of a polarity with respect to said source electrode which will reduce source-drain current flow, and
   - means for applying the charge on said control capacitor to said first constant current circuit for establishing the magnitude of the constant current flow therethrough.

3. A potential controlled oscillator comprising in combination with a direct current potential source, a unijunction transistor having two current-carrying electrodes and a control electrode,
a capacitor,
an output impedance element,
a transistor having two current-carrying electrodes and a control electrode,
means for connecting said current-carrying electrodes of said unijunction transistor and said output impedance element in series across said direct current potential source,
means for connecting said current-carrying electrodes of said transistor and said capacitor in series across said direct current potential source,
means for connecting said control electrode of said unijunction transistor to the junction between said current carrying electrodes of said transistor and said capacitor,
means for producing a bias potential,
a first diode,
means for applying said bias potential across said control electrode and a selected one of said current-carrying electrodes of said transistor through said first diode poled to conduct the control electrode current of said transistor,
a control capacitor,
means for charging said control capacitor by said direct current potential source through a first constant current circuit and variable impedance element for changing the magnitude of the charge of said control capacitor,
a discharging circuit for said control capacitor including a second constant current circuit, and
means for applying the charge on said control capacitor across said control electrode and a selected one of said current-carrying electrodes of said transistor.

4. A potential controlled oscillator comprising in combination with a direct current potential source,
a unijunction transistor having two current-carrying electrodes and a control electrode,
a capacitor,
an output impedance element,
a transistor having two current-carrying electrodes and a control electrode,
means for connecting said current-carrying electrodes of said unijunction transistor and said output impedance element in series across said direct current potential source,
means for connecting said current carrying electrodes of said transistor and said capacitor in series across said direct current potential source,
means for connecting said control electrode of said unijunction transistor to the junction between said current-carrying electrodes of said transistor and said capacitor,
means for producing a bias potential,
a first diode,
means for applying said bias potential across said control electrode and a selected one of said current-carrying electrodes of said transistor through said first diode poled to conduct the control current of said transistor,
a variable impedance element having a movable contact,
means for connecting said variable impedance element across said direct current potential source,
a control capacitor,
a first impedance element,
a first field effect transistor having source and drain electrodes and a control electrode,
means for connecting said control capacitor, said source-drain electrodes of said first field effect transistor and said first impedance element in series across a selected polarity terminal of said direct current potential source and said movable contact of said variable impedance element,
means for connecting said control electrode of said first field effect transistor to the end of said first impedance element which, with current flow therethrough, will provide a potential upon said control electrode of a polarity with respect to said source electrode which will reduce source-drain current flow,
a second field effect transistor having source and drain electrodes and a control electrode,
a second impedance element,
means for connecting said second impedance element and said source-drain electrodes of said second field effect transistor in series across said control capacitor,
means for connecting said control electrode of said second field effect transistor to the end of said second impedance element, which with current flow therethrough, will provide a potential upon said control electrode of a polarity with respect to said source electrode which will reduce source-drain current flow, and
means for applying the charge on said control capacitor across said control electrode and a selected one of said current carrying electrodes of said transistor.

5. A potential controlled oscillator comprising in combination with a direct current potential source,
a unijunction transistor having two current-carrying electrodes and a control electrode,
a capacitor,
an output impedance element,
a transistor having two current-carrying electrodes and a control electrode,
means for connecting said current-carrying electrodes of said unijunction transistor and said output impedance element in series across said direct current potential source,
means for connecting said current-carrying electrodes of said transistor and said capacitor in series across said direct current potential source,
means for connecting said control electrode of said unijunction transistor to the junction between said current-carrying electrodes of said transistor and said capacitor,
first and second resistors,
means for connecting said first and second resistors in series across said direct current potential source,
a first diode,
means for connecting said control electrode of said transistor to the junction between said first and second resistors through said first diode poled to conduct the control electrode current of said transistor,
a potentiometer having a movable contact,
means for connecting said potentiometer across said direct current potential source,
a control capacitor,
a first impedance element,
a first field effect transistor having source and drain electrodes and a control electrode,
means for connecting said control capacitor, said source-drain electrodes of said first field effect transistor and said first impedance element in series across a selected polarity terminal of said direct current potential source and said movable contact of said potentiometer,
means for connecting said control electrode of said first field effect transistor to the end of said first impedance element which, with current flow therethrough, will provide a potential upon said control electrode of a polarity with respect to said source electrode which will reduce source-drain current flow,
a second field effect transistor having source and drain electrodes and a control electrode,
a second impedance element,
means for connecting said second impedance element and said source-drain electrodes of said second field effect transistor in series across said control capacitor,
means for connecting said control electrode of said second field effect transistor to the end of said second impedance element which, with current flow therethrough, will provide a potential upon said control electrode of a polarity with respect to said source electrode which will reduce source-drain current flow,
a second diode, and
means for connecting said second diode across the junction between said first diode and said control electrode of said transistor and a selected plate of said control capacitor and poled to conduct the control electrode current of said transistor.

PO-1050
(5/69)

UNITED STATES PATENT OFFICE
CERTIFICATE OF CORRECTION

Patent No. 3,601,714 Dated August 24, 1971

Inventor(s) Conrad P. Vespie and Elgin J. Karklins

It is certified that error appears in the above-identified patent and that said Letters Patent are hereby corrected as shown below:

Column 4, line 3, after "therethrough" insert -- through --; column 6, line 41, after "said" insert -- direct --; column 7, line 55, after "control" insert -- electrode --.

Signed and sealed this 21st day of March 1972.

(SEAL)
Attest:

EDWARD M.FLETCHER,JR.
Attesting Officer

ROBERT GOTTSCHALK
Commissioner of Patents